United States Patent
De Oliveira

(10) Patent No.: US 10,812,059 B2
(45) Date of Patent: Oct. 20, 2020

(54) COMPARATOR

(71) Applicant: PRAGMATIC PRINTING LTD, Durham (GB)

(72) Inventor: Joao De Oliveira, Longstanton (GB)

(73) Assignee: Pragmatic Printing LTD, Co Durham (GB)

( * ) Notice: Subject to any disclaimer, the term of this patent is extended or adjusted under 35 U.S.C. 154(b) by 0 days.

(21) Appl. No.: 16/292,961

(22) Filed: Mar. 5, 2019

(65) Prior Publication Data

US 2019/0199337 A1    Jun. 27, 2019

Related U.S. Application Data

(63) Continuation of application No. 15/515,623, filed as application No. PCT/GB2015/052883 on Oct. 1, 2015, now abandoned.

(30) Foreign Application Priority Data

Oct. 1, 2014 (GB) .................................. 1417379.3

(51) Int. Cl.
*H03K 5/24* (2006.01)
*H03K 19/094* (2006.01)

(52) U.S. Cl.
CPC .......... *H03K 5/2481* (2013.01); *H03K 5/249* (2013.01); *H03K 19/09432* (2013.01)

(58) Field of Classification Search
CPC .. G11C 7/00; G11C 7/06; G11C 7/062; G11C 7/065; G11C 7/067; G11C 7/14; H03K 19/00; H03K 19/09432; H03K 5/00; H03K 5/2481; H03K 5/249

USPC .......................................................... 327/56
See application file for complete search history.

(56) References Cited

U.S. PATENT DOCUMENTS

| | | | | | |
|---|---|---|---|---|---|
| 4,237,388 | A | * | 12/1980 | Nokubo | H03K 19/01806 326/127 |
| 4,410,815 | A | * | 10/1983 | Ransom | H03K 19/09436 326/30 |
| 5,798,658 | A | * | 8/1998 | Werking | G05F 3/247 326/115 |
| 2004/0135598 | A1 | * | 7/2004 | Koto | H03K 5/2481 327/65 |

(Continued)

*Primary Examiner* — Lincoln D Donovan
*Assistant Examiner* — Dave Mattison
(74) *Attorney, Agent, or Firm* — Robert L. Stearns; Dickinson Wright, PLLC

(57) ABSTRACT

A comparator is disclosed, for comparing a first input voltage with a second input voltage and generating a corresponding output voltage. The comparator includes a follower stage coupled to a first supply rail and a second supply rail, a follower stage input terminal for the second input voltage, and a follower stage output terminal. The comparator also includes an inverter stage comprising a first inverter stage supply terminal coupled to the first supply rail, a second inverter stage supply terminal coupled to the follower stage output terminal, an inverter stage input terminal for the first input voltage, and an inverter stage output terminal for providing an inverter stage output voltage having a first range. A signal conditioning means is coupled to the inverter stage output terminal and generates a comparator output voltage at a comparator output terminal having a second range larger than the first range.

15 Claims, 5 Drawing Sheets

(56) References Cited

U.S. PATENT DOCUMENTS

| | | | | |
|---|---|---|---|---|
| 2007/0008811 A1* | 1/2007 | Keeth | ............... | G11C 5/025 |
| | | | | 365/238.5 |
| 2011/0109348 A1* | 5/2011 | Chen | ............... | H03K 5/2481 |
| | | | | 327/65 |
| 2012/0033507 A1* | 2/2012 | Jeong | ............... | G01K 7/01 |
| | | | | 365/189.07 |
| 2013/0147520 A1* | 6/2013 | Payne | ............... | H03K 5/2481 |
| | | | | 327/51 |

* cited by examiner

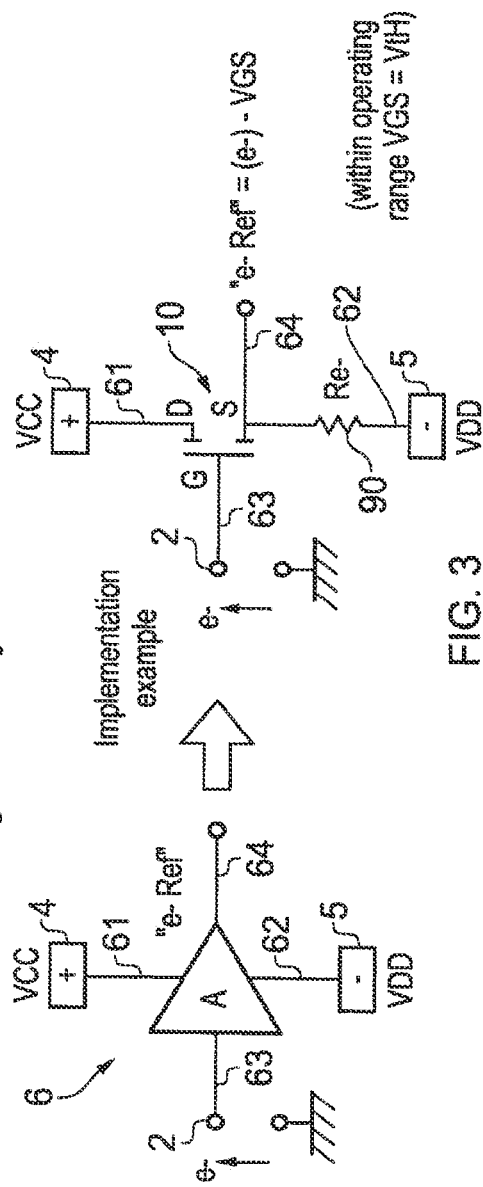
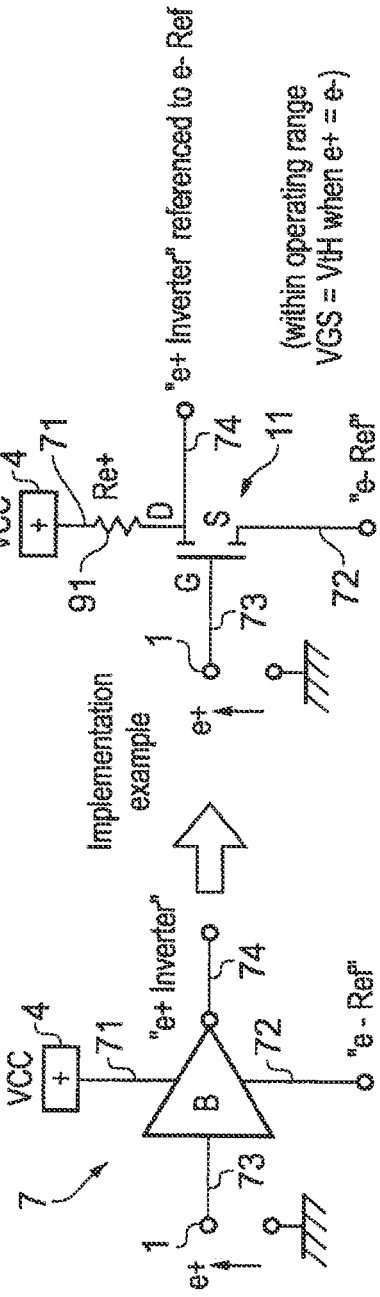
FIG. 3
FIG. 4

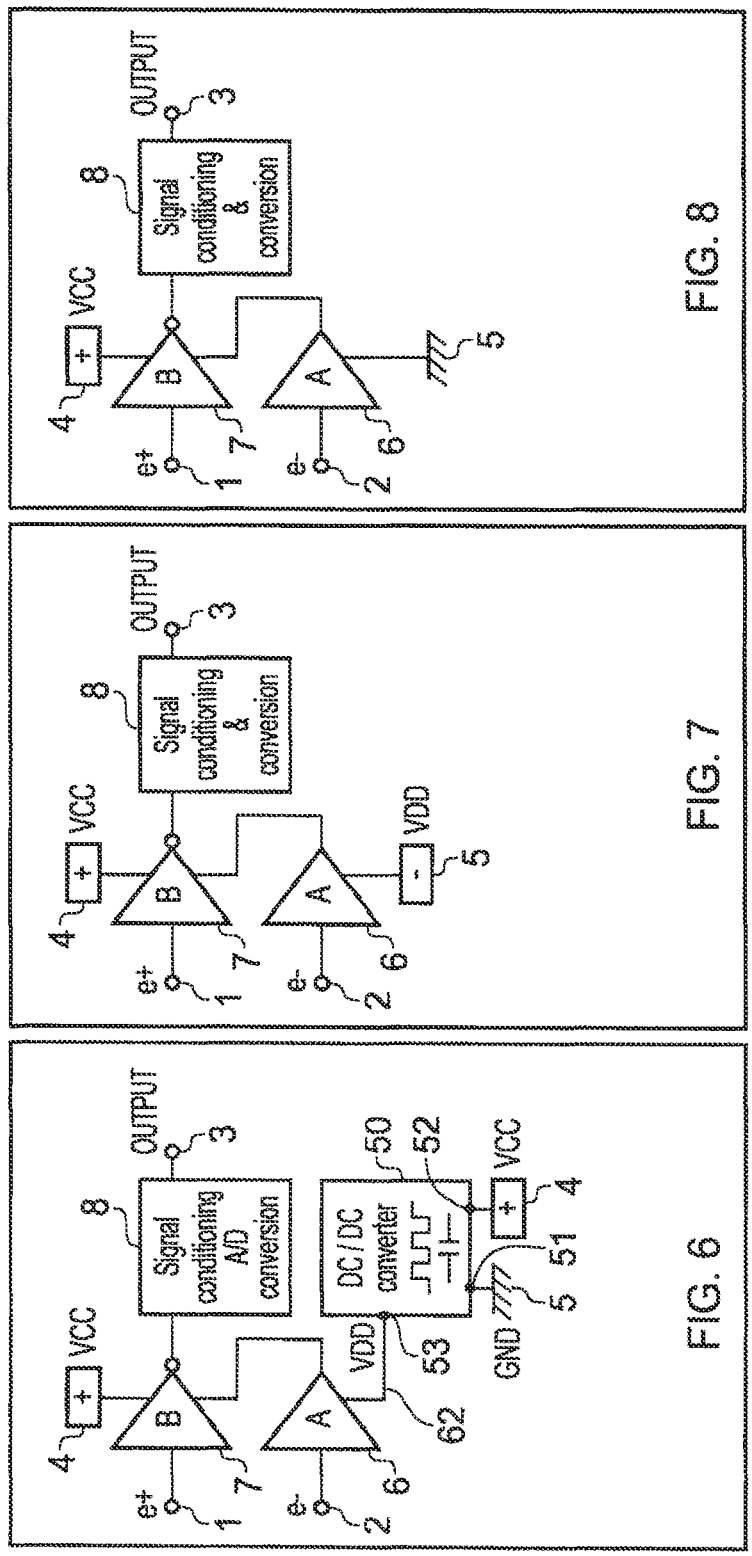

US 10,812,059 B2

COMPARATOR

CROSS-REFERENCE TO RELATED APPLICATIONS

This U.S. Continuation Application claims priority to U.S. Utility application Ser. No. 15/515,623 filed Mar. 30, 2017, which is a National Stage Entry of International Utility Application No. PCT/GB2015/052883 filed Oct. 1, 2015, which claim the benefit of Great Britain Application 1417379.3, filed Oct. 1, 2014. The entire disclosure of each of the above applications is incorporated herein by reference.

BACKGROUND OF THE INVENTION

1. Technical Field

This invention relates to a comparator, which may also be described as a comparator circuit, stage, or module, and to apparatus comprising a comparator.

2. Related Art

Comparators are well-known electronic circuits, for incorporation in a wide variety of circuits and apparatus. FIG. 1 shows a generic symbol representation of a comparator, where VCC is the positive power supply, VDD is the negative power supply, or can be ground, e+ is the input positive sense (voltage range is normally VDD+X to VCC−Y), and e− is the input negative sense (voltage range is normally VDD+X to VCC−Y). When the voltage applied to e+ is higher than the voltage applied to e−, the OUTPUT signal is a logic 1 (close to VCC). When the voltage applied to e+ is lower than the voltage applied to e−, the OUTPUT signal is a logic 0 (close to VDD). The simple basic accuracy (Input offset voltage), is the lowest difference between e+ and e− that will be recognized and trigger the right OUTPUT level. Input offset voltage is typically a few mV to a few tens of mV.

The current comparator implementations typically use differential, mirror current for the front stage, followed by an amplification stage. This requires close to identical transistors, in most cases using complementary transistors as well. Their accuracy (or precision) is mostly linked to the variation between transistors, and even a very small variation has an amplified error effect. Thus, problems associated with known comparators are the need to use closely matched transistors, and the errors associated with use of transistors not closely matched.

SUMMARY OF THE INVENTION

It is an aim or certain embodiments of the invention to overcome at least partly, obviate, or mitigate against, at least one of the problems associated with the prior art.

One aspect of the present invention provides a comparator for comparing a first input voltage with a second input voltage and generating a corresponding output voltage, the comparator comprising: a first input terminal for receiving the first input voltage: a second input terminal for receiving the second input voltage; an output terminal for outputting the output voltage; a first supply rail for providing a first supply voltage; and a second supply rail for providing a second supply voltage, the comparator further comprising: a follower stage comprising a first follower stage supply terminal coupled to the first supply rail, a second follower stage supply terminal coupled to the second supply rail, a follower stage input terminal coupled to the second input terminal, and a follower stage output terminal for providing a follower stage output voltage; and an inverter stage comprising a first inverter stage supply terminal coupled to the first supply rail, a second inverter stage supply terminal coupled to the follower stage output terminal, an inverter stage input terminal coupled to the first input terminal, and an inverter stage output terminal for providing an inverter stage output voltage and coupled to the output terminal.

Advantageously, if the offset voltages of the follower and inverter stages are very similar, the comparator output voltage may switch (alternate) between two states in close and accurate correspondence with the first input voltage exceeding the second voltage and vice versa. Thus, the comparator output may accurately reflect the relationship (comparison) between the two input voltages.

In certain embodiments, the follower stage comprises tuning means for adjusting the follower stage output voltage as a function of voltage provided to the follower stage input terminal. Advantageously, this can enable the offset voltages of the two stages to be made very similar, thereby improving accuracy of the comparator output. In certain embodiments the follower stage tuning means comprises a resistor, which may be a variable resistor.

Similarly, in certain embodiments, the inverter stage comprises tuning means for adjusting the inverter stage output voltage as a function of voltage provided to the inverter stage input terminal. Again, this tuning means may comprise a resistor, which may be fixed or variable.

Certain embodiments further comprise signal conditioning means (e.g. a signal conditioning stage, circuit, or module) coupled between the inverter stage output terminal and the comparator output terminal. This signal conditioning means may convert the inverter output signal (which may be regarded as a "half-digital" signal, to a signal having a wider range (e.g. to a "full-digital" signal, such as a signal alternating between two supply voltages).

In certain embodiments, the inverter stage output voltage has a first range, in use, determined by the voltage applied to the first supply rail and by the follower stage output voltage, and the signal conditioning means is adapted to generate, from the inverter stage output voltage, a comparator output voltage at the comparator output terminal having a second range, where the second range is larger than the first range. In certain embodiments the second range extends substantially from a voltage supplied to the first supply rail to a voltage supplied to the second supply rail.

In certain embodiments the first supply voltage is a positive supply voltage.

In certain embodiments said second supply rail is connected to ground (in other words, said second supply rail may be a ground rail).

In certain embodiments the comparator further comprises a voltage converter (e.g. a DC to DC converter) coupled to the first and second supply rails and to the second follower stage supply terminal and arranged to generate a negative supply voltage and supply said negative supply voltage to the second follower stage supply terminal.

In certain embodiments the second supply voltage is a negative supply voltage.

In certain embodiments the follower stage comprises a transistor. In certain embodiments this transistor is an enhancement mode field effect transistor, FET. In certain embodiments this FET has a gate terminal coupled to the follower stage input terminal, a drain terminal coupled to the first follower stage supply terminal, and a source terminal coupled to the follower stage output terminal and to the second follower stage supply terminal. In certain embodiments the source terminal is coupled to the second follower stage supply terminal by a resistor.

In certain embodiments, the inverter stage comprises a transistor. In certain embodiments, this inverter stage transistor is an enhancement mode field effect transistor, FET, but in alternative embodiments different mode FETs may be used (e.g. depletion mode FETs). In certain embodiments, the inverter stage FET has a gate terminal coupled to the inverter stage input terminal, a drain terminal coupled to the first inverter stage supply terminal and to the inverter stage output terminal, and a source terminal coupled to the follower stage output terminal. In certain embodiments, the inverter stage FET drain terminal is coupled to the first inverter stage supply terminal by a resistor.

In certain embodiments, the comparator further comprises; a controllable switching device arranged to couple the first follower stage supply terminal to the first supply rail, the switching device being controllable to switch between a first state, in which it electrically connects the first follower supply terminal to the first supply rail, and a second state, in which it electrically disconnects the first follower supply terminal from the first supply rail; and control means arranged to control the controllable switching device.

In certain embodiments the control means comprises an oscillator, having an output arranged to control the switching device to alternate between the first and second states.

In certain embodiments the comparator further comprising filtering means (e.g. a band pass filter) arranged between the inverter stage output terminal and the comparator output terminal to filter at least one frequency component (for example a range, or band, of frequencies) from the output voltage.

In certain embodiments, the oscillator output has a fundamental frequency, and the filtering means is arranged to filter out at least said fundamental frequency (e.g. a band of frequencies, including the fundamental frequency).

Another aspect of the invention provides apparatus including a comparator in accordance with any of the above-mentioned aspects or embodiments. For example, in certain embodiments the apparatus is an operational amplifier.

As will be appreciated from the following description, in certain embodiments the comparator approach uses N type transistors only, and relies on offsetting the threshold voltages, Vth, of the two input transistors. (linked to e+ and e−). The closer the Vth of those two transistors, the higher the comparator accuracy is. The accuracy is also achieved by keeping the linearity under control over the input range. For a better linearity, a positive and negative voltage can be applied. In certain embodiments, the comparator may utilise different transistors, i.e. transistors, such as P type transistors, other than N type transistors. In certain embodiments, the comparator may comprise transistors of more than one type, for example it may utilise both N and P type transistors.

BRIEF DESCRIPTION OF THE DRAWINGS

Embodiments of the invention are further described hereinafter with reference to the accompanying drawings, in which:

FIG. 3 illustrates a follower stage which may be used in embodiments of the invention;

FIG. 4 illustrates an inverter stage which may be used in embodiments;
FIGS. 6, 7, and 8 show further comparators embodying the invention.

DETAILED DESCRIPTION

Figure 1:
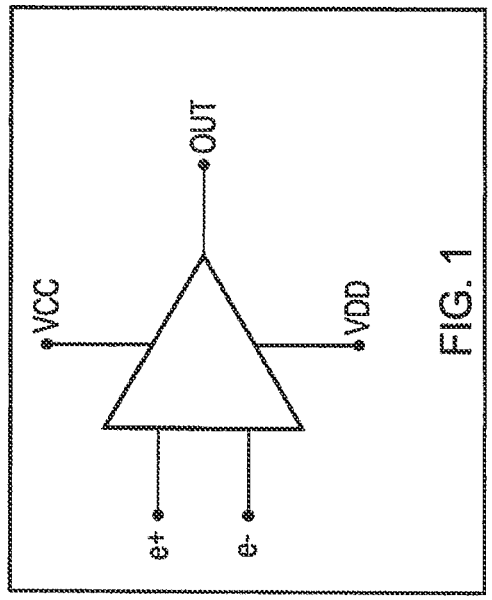
FIG. 1 is a general representation of a comparator.
Figure 2:
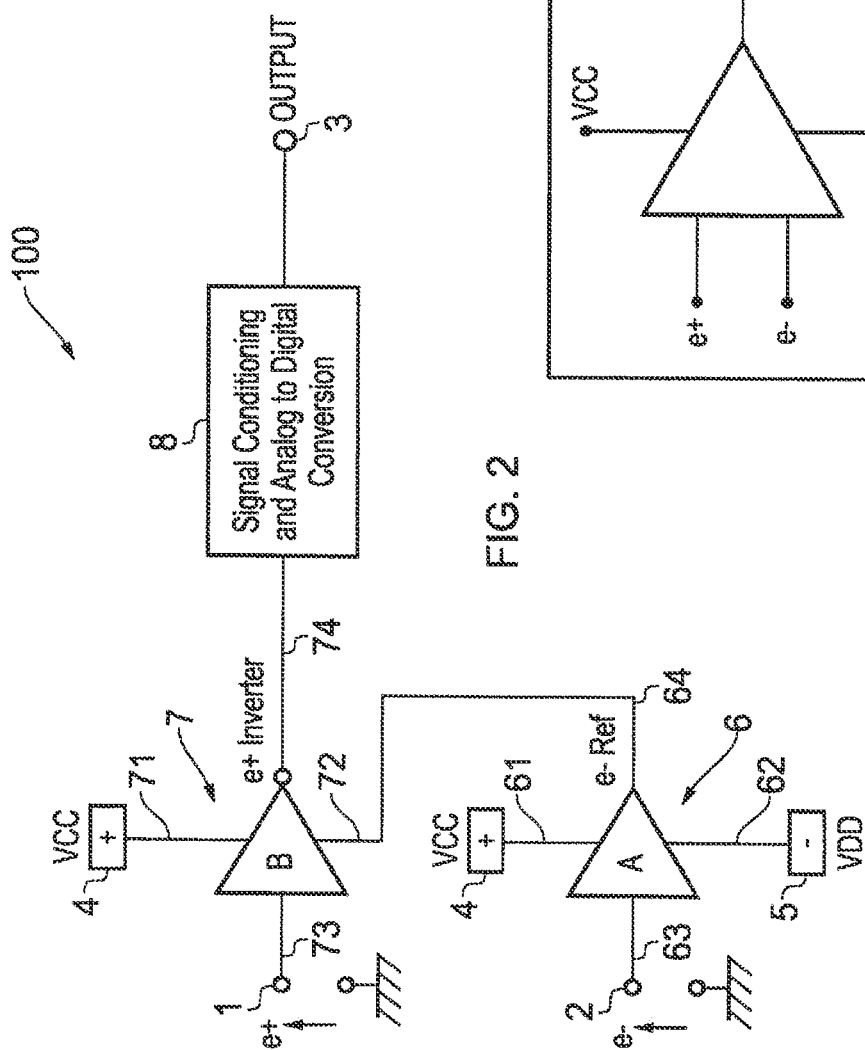
FIG. 2 shows a comparator embodying the invention.

Referring now to the figures, FIG. 2 is a block diagram of a comparator embodying the invention. The comparator 100 is for comparing a first input voltage e+ with a second input voltage e− and generating a corresponding output voltage. The comparator 100 comprises: a first input terminal 1 for receiving the first input voltage: a second input terminal 2 for receiving the second input voltage; an output terminal 3 for outputting the output voltage; a first supply rail 4 for providing a first supply voltage (VCC); and a second supply rail 5 for providing a second supply voltage. The comparator further comprises: a follower stage 6 comprising a first follower stage supply terminal 61 coupled to the first supply rail 4, a second follower stage supply terminal 62 coupled to the second supply rail 5, a follower stage input terminal 63 coupled to the second input terminal 2, and a follower stage output terminal 64 for providing a follower stage output voltage; and an inverter stage 7 comprising a first inverter stage supply terminal 71 coupled to the first supply rail 4, a second inverter stage supply terminal 72 coupled to the follower stage output terminal 64, an inverter stage input terminal 73 coupled to the first input terminal 1, and an inverter stage output terminal 74 for providing an inverter stage output voltage and coupled to the output terminal 3. In this embodiment the first input terminal 1 is directly connected to the inverter input terminal 73 and is provided with first input voltage (or signal) (e+), and the second input terminal 2 is directly connected to the follower stage input terminal 63 and is provided with second input signal or voltage (e−).

A, indicated as 6 in the figure, is a follower stage with its output (e−Ref) equal to (e−) minus the follower stage transistor threshold voltage (Vth_e−). To identify the two Vths of the two transistors (of the follower and inverter stages respectively), we shall call them respectively (Vth_e−) and (Vth_e+)

B, indicated as 7 in the figure, is an inverter stage with its reference (i.e. the low supply voltage) being (e−Ref), so its output (e+Inverter) will be triggered when (e+) is higher than (e−Ref) plus its own (Vth_e+).

So, B (e+Inverter) is triggered when e+>(e−Ref)+Vth_e+, where (e−Ref)=(e+Vth_e−

So (e+Inverter) is triggered when e+>((e−)+Vth_e−)−Vth_e+

So (e+Inverter) is triggered when e+>((e−)+Vth_e−)−Vth_e+, and with everything &se being equal, the comparator would trigger when e+>e−.

B's output signal (e+Inverter), is only a "half digital signal", where its high level is close to VCC, but its low level is proportional to e− input, so a signal conditioning and conversion from "half digital signal" to digital is required in certain embodiments. This signal conditioning and conversion to a full digital signal (e.g. alternating between two supply rail voltages) is provided by the signal conditioning module 8 illustrated in FIG. 2, coupled between the inverter output terminal 74 and the comparator output terminal 3.

FIGS. 3 and 4 illustrate example implementations of follower and inverter stages A and B, where tuning the transistors geometry with respective matching of tuning resistors Re− and Re+, labelled 90 and 91 respectively, allows us to increase the comparator accuracy. In other words, the values of the two resistors may be tuned, selected, adjusted, or otherwise arranged to compensate for differences between the threshold voltages of the two enhancement mode FETS 10, 11, such that the resultant comparator output accurately switches in response to e+ exceeding e−, and vice versa. This provides a straightforward way of constructing a highly accurate comparator, without requiring very close matching of transistor properties. In the follower stage of FIG. 3, (e−Ref)=(e+VGS, and within the operating range VGS=Vth, where VGS is the Gate-Source voltage. In the inverter stage of FIG. 4, "e+Inverter" (i.e. the inverter output voltage) is referenced to (e−Ref), and within the operating range VGS=Vth when e+=e−. Tuning resistor 90 in FIG. 3 is connected between the source of the FET 10 (which is connected to output terminal 64) and the second supply terminal 62 (which is connected to the second supply rail 5). In certain embodiments, resistor 90 has a fixed value. In other embodiments, resistor 90 is a variable resistor. Tuning resistor 91 in FIG. 4 is connected between the drain of the FET 11 (which is connected to output terminal 74) and the first supply terminal 71 (which is connected to the first supply rail 4). In certain embodiments, resistor 91 has a fixed value. In other embodiments, resistor 91 is a variable resistor.

Figure 5:
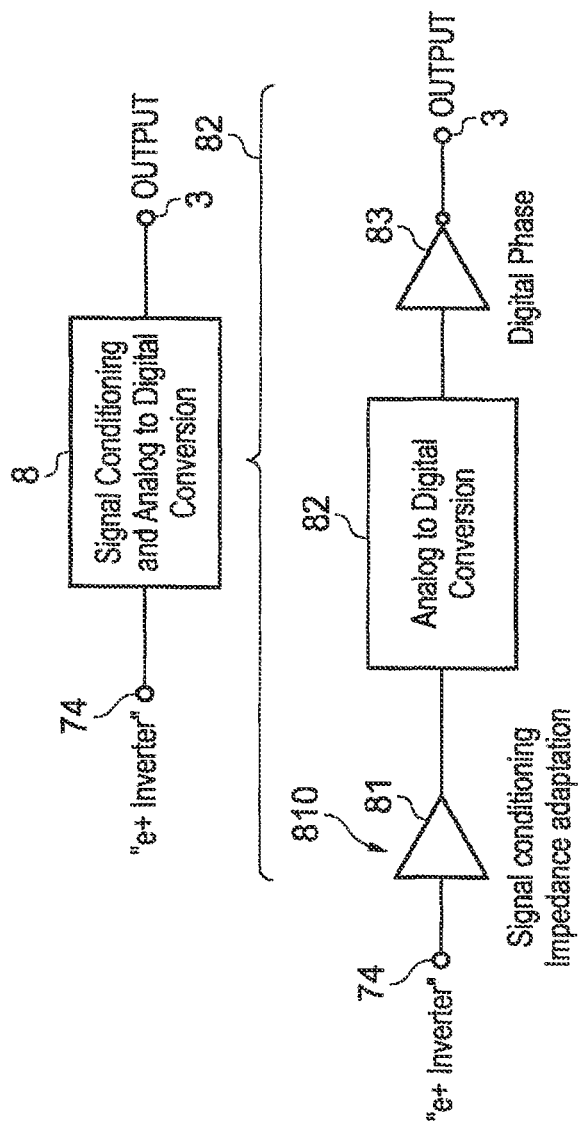
FIG. 5 shows a signal conditioning stage which may be used in embodiments.

Referring now to FIG. 5, as described above, B's output signal (e+Inverter), is only a "half digital signal", where its high level is close to VCC, but its low level is proportional to e− input, So a signal conditioning and conversion from "half digital signal" to digital is required. A follower stage 81 is used in the signal conditioning stage 810, which may also be described as a signal conditioner, or signal conditioning circuit or module, to adapt the impedance to impact as little as possible the comparator front stages. Then we convert the "half digital signal" into a digital signal using an analog to digital converter 82 (which may also be described as an A/D stage or A/D means), followed by an inverter 83 to have the correct OUTPUT signal phase. The conversion from "half digital signal" into digital signal may be implemented using traditional sums of subtractions and voltage divisions, the details of which will be apparent to the skilled person and so are not set out in this specification.

FIGS. 6, 7 and 8 illustrate several possible implementations in different embodiments of the invention.

In the comparator of FIG. 6 only GND and +VCC are provided, and we create the negative signal (VDD) using a DC to DC converter 50 (the details of which will be apparent to be skilled person). This a standalone device with better accuracy due to better linearity (as the comparator follower and inverter stages are provided with negative and positive supply voltages). Thus, the DC/DC converter has inputs 51, 52 connected to ground (the second supply rail 5 in this example) and to the first supply rail 4 respectively, and generates supply voltage VDD at an output terminal 53 which is connected to the second follower supply terminal 62. In this embodiment, the second follower supply terminal 62 is thus coupled to the second supply rail via the voltage converter 50, which is itself connected to ground and to the first supply rail.

FIG. 7 illustrates a comparator providing the same accuracy/linearity as the comparator of FIG. 6, but requires provision of an external negative voltage, as this embodiment comprises no internal DC to DC converter able to generate a negative voltage from a positive voltage and ground.

The comparator of FIG. 8 is supplied with only GND and VCC, and does not incorporate a DC to DC converter for generating a negative supply voltage, so exhibits lower accuracy than those of FIGS. 6 and 7 due to decreased linearity. However, for applications where the comparator of FIG. 8 provides sufficient accuracy and/or linearity, it may provide the advantages of greater simplicity/reduced complexity, and reduced cost. Thus, in this example, the second supply rail is a ground rail.

Figure 9:
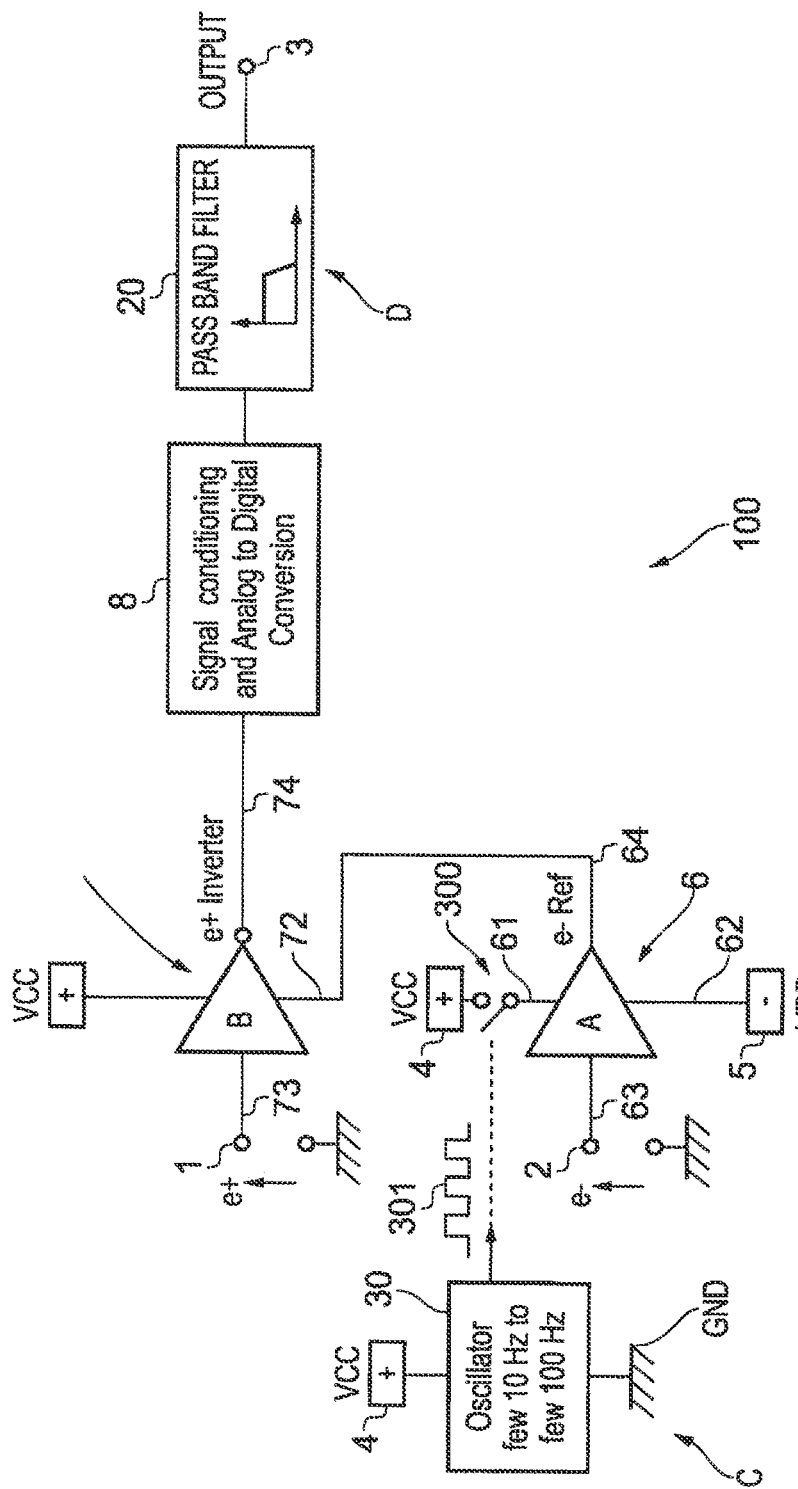
FIG. 9 shows another comparator embodying the invention.

Referring now to FIG. 9, this shows another comparator embodying the invention. This comparator has similar structure to that of the embodiment shown in FIG. 2, but also incorporates some additional features, as follows. Generally, this embodiment has two additional parts, labelled C (an oscillator and switching device) and D (a pass band, or band pass, filter). The goal of this embodiment is to avoid potential "Bias Stress" effects, from transistors to comparator. Those potential "Bias Stress" effects are only seen at DC and low frequencies (typically sub 10 Hz). Potential "Bias Stress" effects, have a detrimental effect on comparator functionality and accuracy. To address this problem, the present embodiment incorporates a controllable switching device 300, connected between the first follower supply terminal 61 and the first supply rail 4, such that the state of the switching device determines whether the supply voltage VCC is being supplied to the first follower supply terminal or not. Thus, the switch 300 (which may take a variety of forms, as will be apparent to the skilled person, is controllable to turn the voltage supply to the first follower supply terminal on an off (such that the voltage at that terminal alternates between VCC and zero volts, for example). The comparator 100 further comprises control means for controlling the switch 300, in this embodiment in the form an oscillator 30, connected to the positive supply rail 4 and to ground GND. The oscillator is arranged to provide a control signal 301 to the switch to control the switch's state. In this example the control signal is a substantially a square wave, and the switching device 300 is responsive to the control signal 301 to alternate (i.e. switch) between a closed state, in which it connects the supply rail 4 to follower terminal 61, and an open state, it which it disconnects the supply rail from follower terminal 61. The oscillator may have a minimum frequency of a few tens of Hz. By incorporating the oscillator in this manner and switching the device 300 on and off, this has the effect of switching ON/OFF the follower output (e−Ref) of the follower A, 6. This makes sure that, internally, the comparator is always operating in AC (alternating mode), even if inputs e+ and e− are DC. As the internal comparator structure is now operating in AC, there is no more "Bias Stress" effects, from transistors to comparator.

The pass band filter 20 is added at the output of the comparator (in fact, in this example, just before the comparator output terminal 3). The filter 20 is thus connected between the inverter output 74 and the comparator output 3. The embodiment of FIG. 9 comprises module 8, connected between terminals 74 and 3, in series with the filter 20, but may be omitted in certain alternative embodiments. The band pass filter allows the comparator to get rid of the "unwanted" frequency component, introduced by the oscillator 30 controlling the switching device 300, from the output signal provided to terminal 3. In other words, in certain embodiments to filter is arranged to eliminate frequency components (from the comparator output) corresponding to the switching frequency of the switching device 300.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

What is claimed is:

1. A comparator for comparing a first input voltage with a second input voltage and generating a corresponding output voltage, the comparator comprising:
   a first input terminal for receiving the first input voltage;
   a second input terminal for receiving the second input voltage;
   an output terminal for outputting the output voltage;
   a first supply rail for providing a first supply voltage;
   a second supply rail for providing a second supply voltage, the comparator further comprising:
   a follower stage comprising:
      a first follower stage supply terminal coupled to the first supply rail;
      a second follower stage supply terminal coupled to the second supply;
      a follower stage input terminal coupled to the second input terminal; and
      a follower stage output terminal for providing a follower stage output voltage;
   an inverter stage comprising:
      a first inverter stage supply terminal coupled to the first supply rail;
      a second inverter stage supply terminal coupled to the follower stage output terminal;
      an inverter stage input terminal coupled to the first input terminal; and
      an inverter stage output terminal for providing an inverter stage output voltage and coupled to the output terminal;
   signal conditioning means coupled between the inverter stage output terminal and the comparator output terminal, a controllable switching device arranged to couple the first follower stage supply terminal to the first supply rail, the switching device being controllable to switch between:
      first state, in which the switching device electrically connects the first follower supply terminal to the first supply rail; and
      a second state, in which the switching device electrically disconnects the first follower supply terminal from the first supply rail;
   control means arranged to control the controllable witching device; and
   filtering means arranged between the inverter stage output terminal and the comparator output terminal to filter at least one frequency component from the output voltage,
   wherein the control means includes an oscillator having an output arranged to control the switching device to alternate between the first and second states, the oscillator output includes a fundamental frequency, and the filtering means is arranged to filter out at least the fundamental frequency,
   wherein the inverter stage output voltage has a first range, in use, determined by the voltage applied to the first supply rail and by the follower stage output voltage, and the signal conditioning means is adapted to generate, from the inverter stage output voltage, a comparator output voltage at the comparator output terminal having a second range, where the second range is larger than the first range, wherein said second range extends substantially from a voltage supplied to the first supply rail to a voltage supplied to the second supply rail, wherein the signal conditioning means comprises a further follower stage, an analog to digital converter, and an inverter connected in series between the inverter stage output terminal and the comparator output terminal, and
   wherein the inverter stage comprises an enhancement mode field effect transistor (FET).

2. The comparator in accordance with claim 1, wherein the follower stage comprises tuning means for adjusting the follower stage output voltage as a function of voltage provided to the follower stage input terminal.

3. The comparator in accordance with claim 2, wherein the follower stage tuning means comprises a resistor.

4. The comparator in accordance with claim 1, wherein the inverter stage comprises timing means for adjusting the inverter stage output voltage as a function of voltage provided to the inverter stage input terminal.

5. The comparator in accordance with claim 4, wherein the inverter stage tuning means comprises a resistor.

6. The comparator in accordance with claim 1, wherein the first supply voltage is a positive supply voltage.

7. The comparator in accordance with claim 1, wherein said second supply rail is connected to ground.

8. The comparator in accordance with claim 7, further comprising a voltage converter coupled to the first and second supply rails and to the second follower stage supply terminal and arranged to generate a negative supply voltage and supply said negative supply voltage to the second follower stage supply terminal.

9. The comparator in accordance with claim 1, wherein the second supply voltage is a negative supply voltage.

10. The comparator in accordance with claim 1, wherein the follower stage comprises a transistor.

11. The comparator in accordance with claim 1, wherein the follower stage comprises an enhancement mode field effect transistor, FET.

12. The comparator in accordance with claim 11, wherein said FET has a gate terminal coupled to the follower stage input terminal, a drain terminal coupled to the first follower stage supply terminal, and a source terminal coupled to the follower stage output terminal and to the second follower stage supply terminal.

13. The comparator in accordance with claim 12, wherein the source terminal is coupled to the second follower stage supply terminal by a resistor.

14. The comparator in accordance with claim 1, wherein said inverter stage FET has a gate terminal coupled to the inverter stage input terminal, a drain terminal coupled to the first inverter stage supply terminal and to the inverter stage output terminal, and a source terminal coupled to the follower stage output terminal.

15. The comparator in accordance with claim 14, wherein the inverter stage FET drain terminal is coupled to the first inverter stage supply terminal by a resistor.

* * * * *